United States Patent
Li et al.

(10) Patent No.: US 10,530,170 B2
(45) Date of Patent: Jan. 7, 2020

(54) METHOD AND SYSTEM OF ADAPTIVE CHARGING

(71) Applicant: RNG INTERNATIONAL INC., Eastvale, CA (US)

(72) Inventors: Yi Li, Eastvale, CA (US); Qing-qiang Zhang, Eastvale, CA (US); Cheng-Cheng Huang, Eastvale, CA (US)

(73) Assignee: RNG International Inc., Eastvale, CA (US)

( * ) Notice: Subject to any disclaimer, the term of this patent is extended or adjusted under 35 U.S.C. 154(b) by 170 days.

(21) Appl. No.: 15/615,767

(22) Filed: Jun. 6, 2017

(65) Prior Publication Data
US 2018/0097387 A1      Apr. 5, 2018

(30) Foreign Application Priority Data

Sep. 30, 2016  (CN) ............... 2016 1 0872582
Sep. 30, 2016  (CN) ............... 2016 1 0873533
(Continued)

(51) Int. Cl.
*H02J 7/00*     (2006.01)
*H01L 31/048*   (2014.01)
(Continued)

(52) U.S. Cl.
CPC ........ *H02J 7/0055* (2013.01); *H01L 31/0481* (2013.01); *H02J 1/10* (2013.01);
(Continued)

(58) Field of Classification Search
CPC .. H02J 7/0055; H02J 7/007; H02J 7/35; H02J 1/10; H02J 2007/0095; H02S 30/10;
(Continued)

(56) References Cited

U.S. PATENT DOCUMENTS 6,433,522 B1 * 8/2002 Siri ..................... G05F 1/67
                                                   320/101
8,629,647 B2 * 1/2014 Bhat ................. H02J 7/0029
                                                   320/101
(Continued)

FOREIGN PATENT DOCUMENTS

CN       101626159 A      1/2010
CN       102244121 A     11/2011
(Continued)

OTHER PUBLICATIONS

First Office Action in the Chinese Patent Application No. 201610873533.X, dated Mar. 23, 2017; English translation attached.
(Continued)

*Primary Examiner* — Richard Isla
*Assistant Examiner* — Michael N Dibenedetto
(74) *Attorney, Agent, or Firm* — Intellectual Valley Law, P.C.

(57) ABSTRACT

An adaptive charging system comprises at least one solar panel and a voltage regulator. The solar panel comprises a protective layer, a first EVA layer, a plurality of solar cells, a plurality of connectors, a second EVA layer and a first supporting layer. The plurality of solar cells are interconnected by the connectors, forming a main body layer. The protective layer, the first EVA layer, the main body layer, the second EVA layer and the first supporting layer are bonded together from top to bottom. The voltage regulator comprises a sampling logic power supply circuit, a microcontroller (MCU) logic circuit, a DC-DC charging circuit, a sampling current conditioning circuit, and a charging matching circuit. When the charging system charges Apple® devices, an automatic reset control logic can be implemented. The system detects the amount of light is changing based on the sampled voltage and the analog voltage signal, and monitors the detection for an additional duration of time.

(Continued)

The voltage regulator is reset when the altered amount of the light is stable.

24 Claims, 8 Drawing Sheets

(30) Foreign Application Priority Data

Sep. 30, 2016 (CN) .................... 2016 2 1099299 U
Sep. 30, 2016 (CN) .................... 2016 2 1099331 U

(51) Int. Cl.
*H02S 30/20* (2014.01)
*H02S 30/10* (2014.01)
*H02J 1/10* (2006.01)
*H02J 7/35* (2006.01)
*H02M 3/158* (2006.01)
*H02S 20/00* (2014.01)
*H02S 99/00* (2014.01)

(52) U.S. Cl.
CPC ............... *H02J 7/007* (2013.01); *H02J 7/35* (2013.01); *H02M 3/1584* (2013.01); *H02S 30/10* (2014.12); *H02S 30/20* (2014.12); *H02J 2007/0095* (2013.01); *H02S 20/00* (2013.01); *H02S 99/00* (2013.01); *Y02E 10/566* (2013.01)

(58) Field of Classification Search
CPC ...... H02S 20/00; H02S 99/00; H02M 3/1584; Y02E 10/566
USPC .......................................... 320/101
See application file for complete search history.

(56) References Cited

U.S. PATENT DOCUMENTS

| 2008/0129117 | A1  | 6/2008  | Kobayashi |            |
|--------------|-----|---------|-----------|------------|
| 2010/0085063 | A1* | 4/2010  | Lebrunie  | H02J 7/0029 |
|              |     |         |           | 324/537    |
| 2011/0187309 | A1* | 8/2011  | Chan      | H01M 10/46 |
|              |     |         |           | 320/101    |
| 2011/0273130 | A1* | 11/2011 | Lee       | H01M 10/465 |
|              |     |         |           | 320/101    |
| 2012/0326512 | A1* | 12/2012 | Yokoyama  | G05F 1/67  |
|              |     |         |           | 307/62     |
| 2015/0115866 | A1* | 4/2015  | Chang     | H02J 7/35  |
|              |     |         |           | 320/101    |
| 2015/0130281 | A1* | 5/2015  | Sabripour | H02J 3/32  |
|              |     |         |           | 307/66     |

FOREIGN PATENT DOCUMENTS

| CN | 102315301 A  | 1/2012  |
|----|--------------|---------|
| CN | 102602114 A  | 7/2012  |
| CN | 202503009 U  | 10/2012 |
| CN | 203645353 U  | 6/2014  |
| CN | 105932083 A  | 9/2016  |
| JP | 2014217218 A | 11/2014 |

OTHER PUBLICATIONS

International Search Report & Written Opinion dated Feb. 11, 2018, regarding PCT/CN2017/105125.

* cited by examiner

METHOD AND SYSTEM OF ADAPTIVE CHARGING

CROSS-REFERENCE TO RELATED APPLICATIONS

This application claims priority to and the benefit of Chinese Patent Application No. 201610872582.1 filed on Sep. 30, 2016, Chinese Patent Application No. 201610873533.X filed on Sep. 30, 2016, Chinese Utility Model Patent Application No. 201621099299.1 filed on Sep. 30, 2016, and Chinese Utility Model Patent Application No. 201621099331.6 filed on Sep. 30, 2016, the disclosures of which are incorporated herein by reference in their entireties.

FIELD OF THE INVENTION

The present disclosure relates in general to photovoltaic technology, and in particular, to a solar-powered adaptive charging method and system.

BACKGROUND

Compared to regular battery and rechargeable battery, solar cells are more environment-friendly. Present solar panels are usually composed of five layers that are pressed and bonded together. From top to bottom the five layers are tempered glass, ethylene vinyl acetate (EVA), solar cell, EVA, backplane. Then a stainless steel frame can be added to hold the panels. Because such solar panels have tempered glass, backplane and steel frame, they are heavy and bulky and usually suitable for outdoor uses, such as rooftop and roadside applications.

Currently there are three types of solar-powered chargers on the market, and they have different charging methods. One type of charger can charge non-Apple® devices normally. The charging current decreases when the amount of light shining on the solar panels decreases, and vice versa. However, Apple® devices have a built-in automatic self-protection mechanism which prevents this type of charger from charging Apple® devices normally when the amount of light changes. In particular, the charging current decreases when the amount of light decreases, but the charging current will not recover when the amount of light increases.

Another type of charger has a built-in voltage regulator. When it is charging Apple® devices, the charging current decreases as the amount of light decreases. When the amount of light increases, the voltage regulator can be automatically reset and the charging current recovers. However, if the amount of light is not stable, the voltage regulator can turn on and off frequently which leads to a bad user experience.

The other type of charger cannot distinguish between Apple® devices and non-Apple® devices at the USB interface. Thus, users have to choose the corresponding charging ports for their devices. When it is charging Apple® devices and the amount of light changes, it can automatically reset after a three minutes delay time, which is not user-friendly.

Therefore there is a need for an adaptive solar charging system.

SUMMARY

The present disclosure relates to an adaptive charging system having at least one solar panel and a voltage regulator. The solar panel can have a protective layer, a first EVA layer, a plurality of solar cells, a plurality of connectors, a second EVA layer and a first supporting layer. The plurality of solar cells can be interconnected by the connectors, forming a main body layer. The protective layer, the first EVA layer, the main body layer, the second EVA layer and the first supporting layer can be bonded together from top to bottom. The voltage regulator can have a sampling logic power supply circuit, a microcontroller (MCU) logic circuit, a DC-DC charging circuit, a sampling current conditioning circuit, and a charging matching circuit. When it is charging Apple® devices, it can start an automatic reset control logic. When it detects the amount of light is changing based on the sampled voltage and the analog voltage signal, it can keep detecting for an additional duration of time. It can reset the voltage regulator when the amount of the light is stable.

The present disclosure relates to an adaptive charging system which includes a first solar panel and a voltage regulator coupled to the solar panel. The voltage regulator can have a processor circuit configured to execute instructions causing the processor circuit to determine a charging voltage of the voltage regulator. If the charging voltage is higher than a pre-defined voltage for a first duration of time, the processor circuit can determine a charging current. If the charging current is lower than a pre-defined current, the processor circuit can restart the voltage regulator after a second duration of time.

In some embodiments, the pre-defined voltage is 4.0-5.0 V. In one embodiment, the pre-defined voltage is 4.85 V. In some embodiments, the pre-defined current is 100-1000 mA. In one embodiment, the pre-defined current is 400 mA. In some embodiments, the first duration of time is 10-100 seconds. In some embodiments, The second duration of time is 1-5 seconds.

The present disclosure relates to an adaptive charging system having a solar panel and a voltage regulator. The voltage regulator can include a sampling logic power supply circuit, a microcontroller (MCU) logic circuit, a DC-DC charging circuit, a sampling current conditioning circuit, and a charging matching circuit. The input terminals of the sampling logic power supply circuit and the DC-DC charging circuit can be connected to a power supply. The output terminals of the DC-DC charging circuit, the MCU logic circuit, the sampling current conditioning circuit, and the charging matching circuit can be connected to an output terminal of the sampling logic power supply circuit. A sampling voltage output terminal of the DC-DC charging circuit can be connected to a sampling voltage input terminal of the MCU logic circuit. A voltage output terminal of the charging matching circuit can be connected to an input terminal of the sampling current conditioning circuit. An output terminal of the sampling current conditioning circuit can be connected to an amplified voltage input terminal of the MCU logic circuit.

In some embodiments, the sampling logic power supply circuit can provide power to the DC-DC charging circuit, the MCU logic circuit, the sampling current conditioning circuit and the charging matching circuit. The DC-DC charging circuit can sample a power supply voltage and outputs the sampled voltage to the MCU logic circuit. The charging matching circuit can convert a charging current from the sampling logic power supply circuit to a voltage signal. The sampling current conditioning circuit can convert the voltage signal to an analog voltage and outputs to the MCU logic circuit.

In some embodiments, the MCU logic circuit can determine the charging current from the analog voltage from the sampling current conditioning circuit.

In some embodiments, in response to the sampled voltage from the DC-DC charging circuit being larger than a pre-determined voltage during a first duration of time t1 and a charging current being smaller than a pre-determined current, the MCU logic circuit can restarts the DC-DC charging circuit after a second duration of time t2, the second duration of time t2 being determined by t2=t1*a, where a is a pre-determined scale factor.

In some embodiments, the sampling logic power supply circuit can have a resistor R1, a resistor R2, a capacitor C1, a capacitor C2, and a power supply integrated circuit chip U1. A terminal of the resistor R1, a terminal of the capacitor C1 and an input supply voltage terminal of the power supply chip U1 can be connected to the power supply. A terminal of the capacitor C1 can be connected to a ground terminal of the power supply chip U1. A terminal of the resistor R1 can be connected to an enable input terminal of the power supply chip U1. A terminal of the resistor R2 can be connected to an output terminal of the power supply chip U1 through the capacitor C2. A terminal of the resistor R2 can be connected to ground. Input supply terminals of the DC-DC charging circuit, the MCU logic circuit, the sampling current conditioning circuit, and the charging matching circuit can be connected to the output terminal of the power supply chip U1.

In some embodiments, the DC-DC charging circuit can have a resistor R3, a resistor R4, a resistor R5, a resistor R6, a capacitor C3, a capacitor C4, a capacitor C5, a diode D1, an inductor L1, and a converter U2. An input supply terminal of the converter U2 and a terminal of the capacitor C3 can be connected to the power supply. A terminal of the resistor R3 and a terminal of the resistor R4 can be connected to a power switch output terminal of the converter U2. A terminal of the resistor R3 can be connected to ground. A terminal of the resistor R4, a terminal of the inductor L1, a terminal of the capacitor C4, and a terminal of the resistor R5 can be connected to a power supply terminal of the charging matching circuit. A terminal of the inductor L1 and a negative terminal of the diode D1 can be connected to an enable terminal of the converter U2. A terminal of the resistor R5 and a terminal of the resistor R6 can be connected to a sampling voltage input terminal of the MCU logic circuit. A ground terminal of the converter U2, the negative terminal of the diode D1, a terminal of the capacitor C3, a terminal of the capacitor C4, and a terminal of the resistor R6 can be connected to ground. The capacitors C5 and C4 can be connected in parallel. A terminal of the resistor R5 can be connected to the output terminal of the power supply chip U1. In some embodiments, the converter U2 can be TD1583. In some embodiments, the converter U2 can be XL1583.

In some embodiments, the charging matching circuit can have a USB port, a resistor R7, a resistor R8, a resistor R9, a resistor R10, and a resistor R11. A terminal of the resistor R7 can be connected to a forth pin of the USB port. Resistors R8 and R9 can be connected in series and form a first serial branch. Resistors R10 and R11 can be connected in series and form a second serial branch. A third pin of the USB port can be connected between the resistor R10 and the resistor R11. A second pin of the USB port can be connected between the resistor R8 and the resistor R9. A first pin of the USB port, a terminal of the first serial branch, and a terminal of the second serial branch can be connected to the output terminal of the power supply chip U1. A terminal of the first serial branch, a terminal of the second serial branch, the input terminal of the sampling current conditioning circuit can be connected to the forth pin of the USB port.

In some embodiments, the sampling current conditioning circuit can have the resistor R11, a resistor R12, a resistor R13, a resistor R14, a resistor R15, a capacitor C6, a capacitor C7, a capacitor C8, an operational amplifier U3, and an operational amplifier U4. A non-inverting input terminal of the operational amplifier U3 can be connected to the forth pin of the USB port through the resistor R11. A supply voltage terminal of the operational amplifier U3 and a terminal of the capacitor C6 can be connected to the output terminal of the power supply chip U1. A terminal of the capacitor C6 can be connected to ground. A terminal of the resistor R12 and a terminal of the resistor R13 can be connected to an output terminal of the operational amplifier U3. A terminal of the resistor R13 and a terminal of the resistor R14 can be connected to an inverting terminal of the operational amplifier U3. A terminal of the resistor R14 can be connected to ground. A terminal of the resistor R12 can be connected to a non-inverting input terminal of the operational amplifier U4 through the resistor R15. A terminal of the capacitor C7 can be connected between the resistor R12 and the resistor R15. A terminal of the capacitor C7 can be connected to an output terminal of the operational amplifier U4. A terminal of the capacitor C8 can be connected between the resistor R15 and the non-inverting input terminal of the operational amplifier U4. A terminal of the capacitor C8 can be connected to ground. An inverting input terminal and an output terminal of the operation amplifier U4 can be connected to the input voltage terminal of the MCU logic circuit. In some embodiments, each of the operational amplifiers U3 and U4 can be LM2904.

In some embodiments, the MCU logic circuit can have a resistor R16, a resistor R17, a resistor R18, a capacitor C9, a capacitor C10, and a microcontroller U5. A terminal of the capacitor C9 can be connected to the output terminal of the power supply chip U1 through the resistor R16. A PB5 terminal of the microcontroller U5 can be connected between the resistor R16 and the capacitor C9. A PB4 terminal of the microcontroller U5 can be connected between the resistor R5 and the resistor R6. A PB3 terminal of the microcontroller U5 can be connected to the output terminal of the operational amplifier U4. A supply voltage terminal of the microcontroller U5 and a terminal of the capacitor C10 can be connected to the output terminal of the power supply chip U1. A terminal of the capacitor C10 can be connected to ground. A terminal of the resistor R17 can be connected to a PB0 terminal of the microcontroller U5. A terminal of the resistor R18 can be connected to a PB1 terminal of the microcontroller U5. A terminal of the resistors R17 and R18 can be connected to ground. In some embodiments, the microcontroller U5 can be ATtiny13.

It would be understood that any embodiments disclosed herein can be applied, when applicable, in any aspect of the invention, alone or in any combination.

Details of one or more implementations are set forth in the accompanying drawings and the description below. Other features, aspects, and potential advantages will be apparent from the description and drawings, and from the claims.

BRIEF DESCRIPTION OF THE DRAWINGS

Those of skill in the art will understand that the drawings, described below, are for illustrative purposes only. The drawings are not intended to limit the scope of the present teachings in any way.

Like reference symbols in the various drawings indicate like elements.

DETAILED DESCRIPTION

Figure 1:
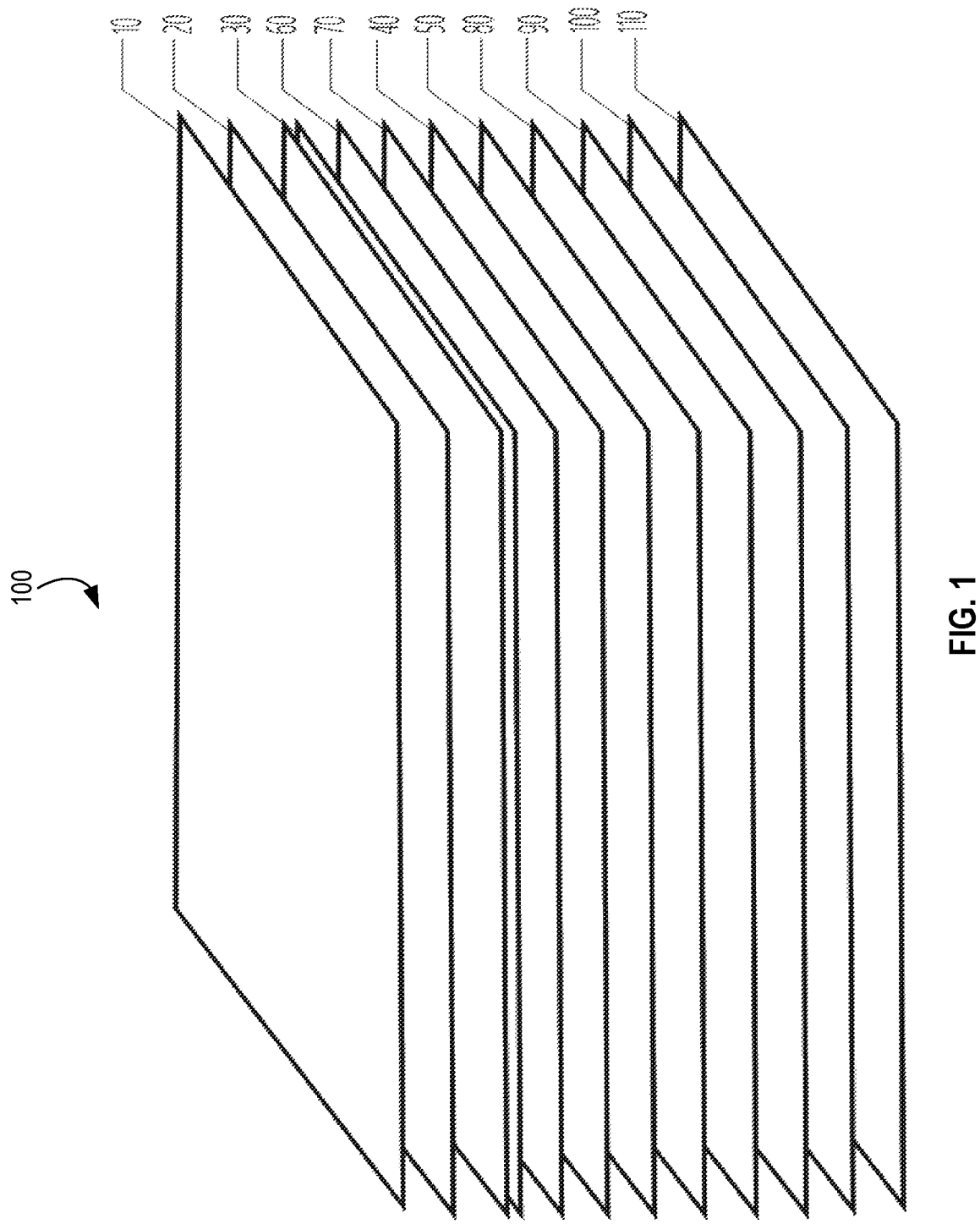
FIG. 1 shows an illustrative view of a sample solar panel in accordance with an embodiment of the present disclosure.

In view of the foregoing disadvantages inherent in the known types of solar-powered charger now present in the related art, it is one objective of the present disclosure to provide an adaptive charging method and system comprising one or more solar panels and a voltage regulator.

Solar panels absorb sun light, and directly or indirectly convert the solar energy into electricity through photoelectric effect or photochemical effect. Solar panels are usually encapsulated using a laminator. The laminator presses and bonds multiple layers of materials together at high temperature and under vacuum. The upper cover of the laminator has a flexible airbag. An upper chamber is formed between the airbag and the top of the upper cover. When the upper cover is closed, a lower chamber is formed between the airbag and a heating plate. An exemplary process for operating the laminator after the upper cover is closed is illustrated as follows:

1. Pumping: the lower and upper chambers are being pumped down. Vacuum valves to both chambers are open while all solenoid valves are closed. At this step, the airbag is parallel with the heating plate;
2. Pressurizing: the lower chamber remains under vacuum while the upper chamber is being inflated. Vacuum valves to the upper chamber are closed and inflation valves to the upper chamber are open, and the upper chamber is being inflated with atmosphere air. At this step, the mid-portion of the airbag moves downwards and approaches the heating plate;
3. Pressing and bonding: the lower chamber is under vacuum and the upper chamber is at atmospheric pressure. Inflation valves to the upper chamber are closed while the other valves remain unchanged. At this step, solar panel layers are pressed between the airbag and the heating plate with the mid-portion of the airbag touching the heating plate;
4. Cover opening: the lower chamber is being inflated and the upper chamber is being pumped down. Vacuum valves to the upper chamber are open and vacuum valves to the lower chamber are closed. Inflation valves to the lower chamber are open to let atmosphere air flow into the lower chamber; when the lower chamber is inflated, the upper cover can be open.

A solar panel can comprise a protective layer, a first EVA layer, a plurality of solar cells, a plurality of connectors, a second EVA layer, and a first supporting layer. The solar cells can be interconnected by the plurality of connectors, forming a main body layer. The protective layer, the first EVA layer, the main body layer, the second EVA layer, and the first supporting layer can be compressed and bonded together.

In some embodiments, the solar cells can be divided into two groups, a first solar cell group and a second solar cell group. The plurality of connectors can include first connectors, second connectors and third connectors. The solar cells in the first solar cell group can be connected in series by the first connectors. The solar cells in the second solar cell group can be connected in series by the second connectors. The first and second solar cell groups can be connected in parallel by the third connectors.

In some embodiments, the solar panel can further comprise a plurality of first positioning strips and a plurality of second positioning strips. The solar cells in the first solar cell group can be disposed side-by-side with a first gap between every two cells. A first positioning strip of the plurality of first positioning strips can be disposed in the first gap. The solar cells in the second solar cell group can be disposed side-by-side with a second gap between every two cells. A second positioning strip of the plurality of second positioning strips can be disposed in the second gap.

In some embodiments, the solar panel further can comprise a third EVA layer and a substrate. From top to bottom, the protective layer, the first EVA layer, the main body layer, the third EVA layer, the substrate, the second EVA layer, and the first supporting layer can be pressed and bonded together.

In some embodiments, the solar panel can further comprise a forth EVA layer and a second supporting layer. From top to bottom, the protective layer, the first EVA layer, the main body layer, the third EVA layer, the substrate, the second EVA layer and the first supporting layer, the forth EVA layer and the second supporting layer can be pressed and bonded together.

In some embodiments, the solar panel can further comprise a fifth EVA layer and a fabric layer. From top to bottom, the protective layer, the first EVA layer, the main body layer, the third EVA layer, the substrate, the second EVA layer, the first supporting layer, the forth EVA layer, the second supporting layer, the fifth EVA layer, and the fabric layer can be pressed and bonded together.

In some embodiments, the protective layer can be one or more ethylene tetrafluoroethylene (ETFE) sheets. The solar cells can be single-crystal silicon. The connectors can be copper wires. The positioning strips can be expanded polyethylene (EPE) strips. The substrate can be one or more polyethylene terephthalate (PET) sheets. The first supporting layer can be one or more epoxy boards. The second supporting layer can be one or more Tedlar/PET/Tedlar (TPT) sheets. The fabric layer can be one or more 420D nylon sheets.

In some embodiments, the thickness of the ETFE sheet can be 0.01-1 mm. The first solar cell group may comprise ten solar cells, and the second solar cell group may comprise ten solar cells. The thickness of the EPE strips can be 0.1-1 mm. The substrate may comprise two PET sheets and the thickness of the PET sheet can be 0.5-2.5 mm. The first supporting layer may comprise two epoxy boards and the thickness of the epoxy board can be 0.5-2.5 mm. The second supporting layer can comprise two TPT sheets and the thickness of the TPT sheet can be 0.1-1 mm. The thickness of the fabric layer can be 0.1-1 mm. The first EVA layer may comprise one EVA sheet. The second, third, forth, and fifth EVA layers may all comprise two EVA sheets. The thickness of the EVA sheet can be 0.1-1 mm.

The second objective of the present disclosure is achieved as follows. A method for manufacturing a solar panel comprises:

1. assembling the multiple layers in order and placing the assembled stack in the laminator;
2. pumping the upper chamber for 310±20 s, and pumping the lower chamber for 300±20 s;
3. pressurizing the upper chamber to −70±5 kPa for 5±2 s while keeping the lower chamber under vacuum;
4. pressurizing the upper chamber to −60±5 kPa for 5±2 s while keeping the lower chamber under vacuum;
5. pressurizing the upper chamber to 0 kPa for 540±5 s while keeping the lower chamber under vacuum, and setting the heating temperature to 142±5° C.;
6. keeping the lower chamber under vacuum for 20±5 s;
7. inflating the lower chamber for 50±5 s.

In some embodiments, the method can further comprise an eighth step: placing the solar panel into a laser cutting machine for edge trimming and/or hole drilling.

The present disclosure provides a solar panel with multiple layers stacked in order so that good bonding can be achieved. In some embodiments, the one or more ETFE sheets as a protective layer can be waterproof and aging-resistant. It can prevent the panels from being broken or scratched. It can also prevent water penetrating into the panels and shorting related circuits. It can also prevent the solar panels from being damaged by other objects such as hail, sand, or stones. It can shield the solar panels from outside hazard environment and minimize the degradation of the performance.

In some embodiments, the EPE positioning strips can be disposed between every two solar cells. When the airbag presses down, because the EVA sheet is soft and adhesive at high temperature, the solar cells can be shifted if no EPE positioning strips are present. In some embodiments, an EFE sheet with cutout spaces is provided. Each cutout space can accommodate a solar cell. In some embodiments, the cut space adapts a shape that is the same or similar to that of the solar cell. In some embodiments, the EPE positioning strips has a different color from the solar cells (e.g., white, blue, green, grey, and etc.) for decorative purposes.

As used herein, the term "solar cell" refers to the component for converting solar energy into electrical energy. In some embodiments, the terms "solar cell" and "battery sheet" can be used interchangeably. In some embodiments, a solar cell is silicon-based. In some embodiments, a solar cell does not comprise silicon and instead comprises other composite solar materials, e.g., copper indium gallium selenide (CIGS), cadmium telluride (CdTe), gallium arsenide (GaAs). In some embodiments, a solar cell can comprise organic solar materials or polymer solar materials. In some embodiments, a solar cell can be a dye-sensitized solar cell.

In some embodiments, the substrate can also be decorative. The substrate can be made of different materials including but not limited to plastic, metal, wood, etc. The substrate can also have different colors including but not limited to white, black, red, blue, green, grey, etc.

In some embodiments, one or more epoxy boards form the first supporting layer to provide support for all the layers above it and to prevent the panel from being broken. In some embodiments, the one or more epoxy boards can have different thicknesses. In some embodiments, the one or more epoxy boards can have different colors including but not limited to white, black, red, blue, green, grey, etc.

In some embodiments, one or more TPT sheets can be used as the second supporting layer to provide further support because TPT features high weather-resistance and inherent strength. In some embodiments, the one or more TPT sheets can have different thicknesses. In some embodiments, the one or more TPT sheets can have different colors including but not limited to white, black, red, blue, green, grey, etc.

In some embodiments, one or more 420D nylon sheets can be used as the fabric layer provides a decorative and protective surface. The nylon sheets can prevent the solar panels from being scratched or damaged. In some embodiments, the nylon sheets can have different colors including but not limited to white, black, red, blue, green, grey, etc.

The adaptive charging system can comprise a voltage regulator which converts an output voltage of the solar panel into a charging voltage. The voltage regulator generally comprises a sampling logic power supply circuit, a microcontroller (MCU) logic circuit, a DC-DC charging circuit, a sampling current conditioning circuit, a charging matching circuit. The input terminals of the sampling logic power supply circuit and the DC-DC charging circuit can be connected to a same power supply. The output terminals of the DC-DC charging circuit, the MCU logic circuit, the sampling current conditioning circuit, and the charging matching circuit can be connected to the output terminal of the sampling logic power supply circuit. The sampling voltage output terminal of the DC-DC charging circuit can be connected to the sampling voltage input terminal of the MCU logic circuit. The voltage output terminal of the charging matching circuit can be connected to the input terminal of the sampling current conditioning circuit. The output terminal of the sampling current conditioning circuit can be connected to the amplified voltage input terminal of the MCU logic circuit.

The sampling logic power supply circuit provides power to the DC-DC charging circuit, the MCU logic circuit, the sampling current conditioning circuit and the charging matching circuit. The DC-DC charging circuit samples the power supply voltage and outputs the sampled voltage to the MCU logic circuit. The charging matching circuit converts the charging current from the sampling logic power supply circuit to a voltage signal. The sampling current conditioning circuit converts the voltage signal to an analog voltage signal and outputs to the MCU logic circuit. The MCU logic circuit receives the sampled voltage from the DC-DC charging circuit and the analog voltage signal from the sampling current conditioning circuit, and controls the on and off of the DC-DC charging circuit.

In some embodiments, the MCU logic circuit obtains the magnitude of the charging current from the analog voltage signal provided by the sampling current conditioning circuit. If it determines that the sampled voltage from the DC-DC charging circuit is larger than a first pre-determined voltage value during a first pre-determined duration of time t1. it then determines if the charging current is larger than a pre-determined current value. If yes, the MCU logic circuit can turn off the DC-DC charging circuit and turn it on after a second pre-determined duration of time t2. The second pre-determined duration of time t2 is determined by t2=t1*a, where a is a pre-determined scale factor.

In some embodiments, the sampling logic power supply circuit can comprise a resistor R1, a resistor R2, a capacitor C1, a capacitor C2, and a power supply integrated circuit chip U1. One terminal of the resistor R1, one terminal of the capacitor C1 and the input supply voltage terminal of the power supply chip U1 can all be connected to the power supply. The other terminal of the capacitor C1 can be connected to the ground terminal of the power supply chip U1. The other terminal of the resistor R1 can be connected to the enable input terminal of the power supply chip U1. One terminal of the resistor R2 can be connected to the output terminal of the power supply chip U1 through the capacitor C2 and the other terminal of the resistor R2 can be connected to the ground. Input supply terminals of the DC-DC charging circuit, the MCU logic circuit, the sampling current conditioning circuit, and the charging matching circuit can all be connected to the output terminal of the power supply chip U1.

In some embodiments, the DC-DC charging circuit can comprise a resistor R3, a resistor R4, a resistor R5, and a resistor R6. It can also comprise a capacitor C3, a capacitor C4, and a capacitor C5. It can also comprise a diode D1, an inductor L1 and a converter U2. The input supply terminal of the converter U2 and one terminal of the capacitor C3 can be connected to the power supply. One terminal of the resistor R3 and one terminal of the resistor R4 can all be connected to the power switch output terminal of the converter U2. The other terminal of the resistor R3 can be connected to the ground. The other terminal of the resistor R4, one terminal of the inductor L1, one terminal of the capacitor C4, and one terminal of the resistor R5 can all be connected to the power supply terminal of the charging matching circuit. The other terminal of the inductor L1 and the negative terminal of the diode D1 can be connected to the enable terminal of the converter U2. The other terminal of the resistor R5 and the one terminal of the resistor R6 can be connected to the sampling voltage input terminal of the MCU logic circuit. The ground terminal of the converter U2, the negative terminal of the diode D1, the other terminal of the capacitor C3, the other terminal of the capacitor C4, and the other terminal of the resistor R6 can all be connected to the ground. The capacitors C5 and C4 are connected in parallel. One terminal of the resistor R5 can be connected to the output terminal of the power supply chip U1.

In some embodiments, the charging matching circuit can comprise a USB port, a resistor R7, a resistor R8, a resistor R9, a resistor R10, and a resistor R11. One terminal of the resistor R7 can be connected to the forth pin of the USB port. Resistors R8 and R9 can be connected in series, forming a first serial branch. Resistors R10 and R11 can be connected in series, forming a second serial branch. The third pin of the USB port can be connected between the resistor R10 and the resistor R11. The second pin of the USB port can be connected between the resistor R8 and the resistor R9. The first pin of the USB port, one terminal of the first serial branch, and one terminal of the second serial branch can all be connected to the output terminal of the power supply chip U1. The other terminal of the first serial branch, the other terminal of the second serial branch, and the input terminal of the sampling current conditioning circuit can all be connected to the forth pin of the USB port.

In some embodiments, the sampling current conditioning circuit can comprise the resistor R11, a resistor R12, a resistor R13, a resistor R14, a resistor R15, a capacitor C6, a capacitor C7, a capacitor C8, an operational amplifier U3, and an operational amplifier U4. The non-inverting input terminal of the operational amplifier U3 can be connected to the forth pin of the USB port through the resistor R11. The supply voltage terminal of the operational amplifier U3 and one terminal of the capacitor C6 can be connected to the output terminal of the power supply chip U1. The other terminal of the capacitor C6 can be connected to the ground. One terminal of the resistor R12 and one terminal of the resistor R13 can be connected to the output terminal of the operational amplifier U3. The other terminal of the resistor R13 and one terminal of the resistor R14 can be connected to the inverting terminal of the operational amplifier U3. The other terminal of the resistor R14 can be connected to the ground. The other terminal of the resistor R12 can be connected to the non-inverting input terminal of the operational amplifier U4 through the resistor R15. One terminal of the capacitor C7 can be connected between the resistor R12 and the resistor R15, and the other terminal of the capacitor C7 can be connected to the output terminal of the operational amplifier U4. One terminal of the capacitor C8 can be connected between the resistor R15 and the non-inverting input terminal of the operational amplifier U4, and the other terminal of the capacitor C8 can be connected to the ground. The inverting input terminal and the output terminal of the operation amplifier U4 can be connected to the amplified voltage input terminal of the MCU logic circuit.

In some embodiments, the MCU logic circuit can comprise a resistor R16, a resistor R17, a resistor R18, a capacitor C9, a capacitor C10, and a microcontroller U5. One terminal of the capacitor C9 can be connected to the output terminal of the power supply chip U1 through the resistor R16. The PB5 terminal of the microcontroller U5 can be connected between the resistor R16 and the capacitor C9. The PB4 terminal of the microcontroller U5 can be connected between the resistor R5 and the resistor R6. The PB3 terminal of the microcontroller U5 can be connected to the output terminal of the operational amplifier U4. The supply voltage terminal of the microcontroller U5 and one terminal of the capacitor C10 can be connected to the output terminal of the power supply chip U1. The other terminal of the capacitor C10 can be connected to the ground. One terminal of the resistor R17 can be connected to the PB0 terminal of the microcontroller U5. One terminal of the resistor R18 can be connected to the PB1 terminal of the microcontroller U5. The other terminals of the resistors R17 and R18 can be connected to the ground.

Compared to the related art, the present disclosure has the following advantages. When it is charging Apple® devices, it starts an automatic reset control logic. When it detects the amount of light is changing based on the sample voltage and the analog voltage signal, it keeps detecting for an additional duration of time. It only resets the voltage regulator when the amount of the light is stable. Thus, the present disclosure provides stable power supply to Apple® devices.

In order to facilitate a fuller understanding of the present disclosure, reference is now made to the accompanying drawing, in which like elements are referenced with like numerals. These drawings should not be construed as limiting the present disclosure, but are intended to be illustrative only.

Solar Panel

Embodiment 1

Referring to FIG. 1, one embodiment of a solar panel according to the present invention is illustrated. A solar panel can comprise a protective layer 10, a first EVA layer 20, a plurality of solar cells 31, a plurality of connectors, a second EVA layer 40, and a first supporting layer 50. The plurality of solar cells 31 can be interconnected by the connectors, forming a main body layer 30. From top to bottom, the protective layer 10, the first EVA layer 20, the main body layer 30, the second EVA layer 40 and the first supporting layer 50 can be pressed and bonded together.

The configuration of the main body layer is further described as follows.

Figure 2:
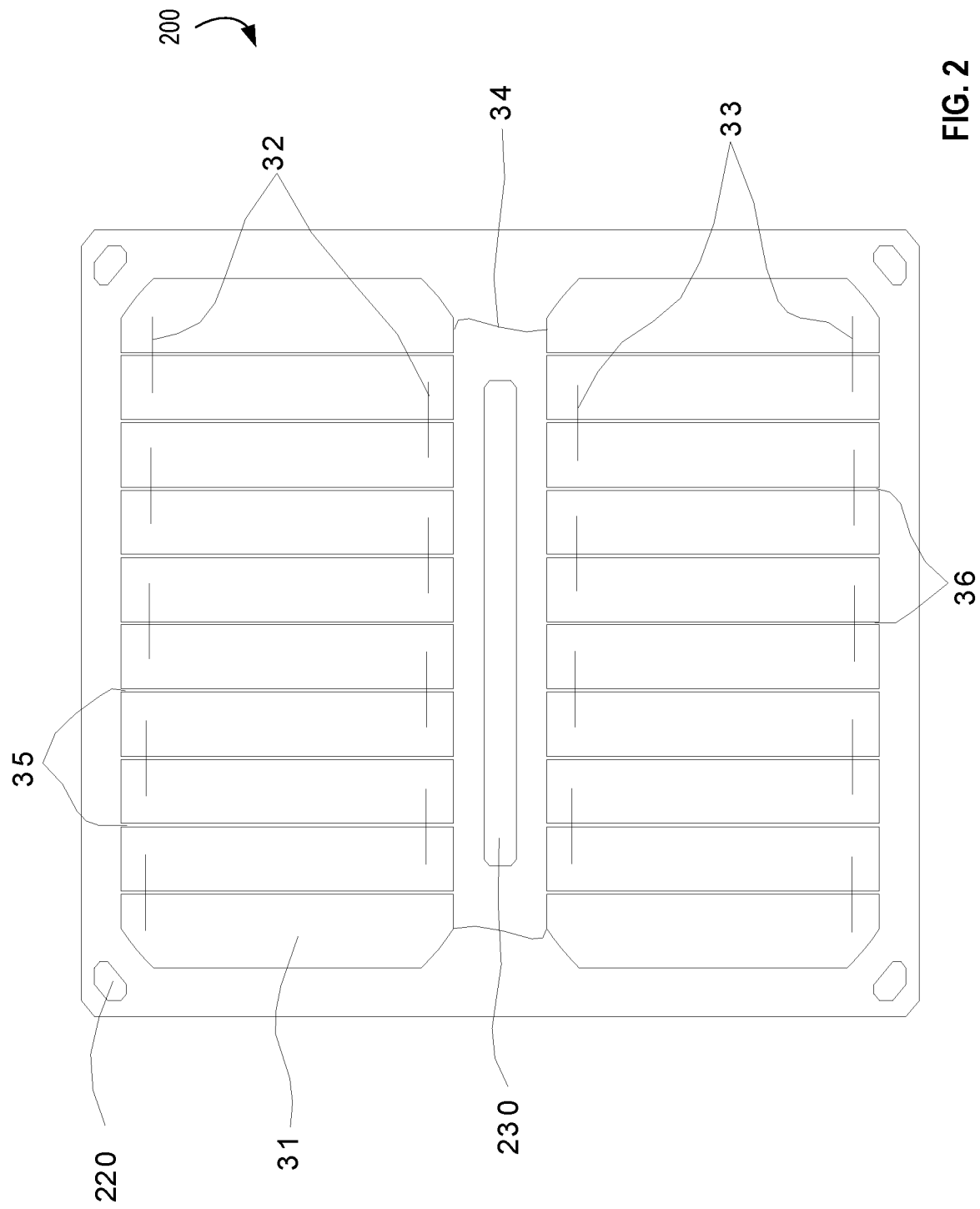
FIG. 2 shows a connection diagram of a sample solar panel in accordance with an embodiment of the present disclosure.

Referring to FIG. 2, the plurality of solar cells 31 can be divided into two groups, a first solar cell group and a second solar cell group. The plurality of connectors can comprise first connectors 32, second connectors 33, and third connectors 34. Solar cells in the first solar cell group can be connected in series by the first connectors 32. Solar cells in the second solar cell group can be connected in series by the second connectors 33. The first and second solar cell groups can be connected in parallel by the third connectors 34. The combination of serial and parallel connections provides more output current. In some embodiments, the solar panel can have an open circuit voltage of 6 V which can be converted to 5V by a voltage regulator, to charge mobile devices.

Embodiment 2

The second embodiment can further comprise a plurality of first positioning strips and a plurality of second positioning strips. As shown in FIG. 2, solar cells 31 in the first solar cell group can be disposed side-by-side with a first gap 35 between every two cells. A first positioning strip of the plurality of first positioning strips can be disposed in the first gap 35. Solar cells 31 in the second solar cell group can be disposed side-by-side with a second gap 36 between every two cells. A second positioning strip of the plurality of second positioning strips can be disposed in the second gap 36.

The first and second positioning strips can all be EPE strips which can help the solar cells 31 remain in position. When the airbag presses down, because the one or more EVA sheets is soft and adhesive at high temperature, the solar cell can be shifted if no EPE positioning strips are present. In some embodiments, one or more EFE sheets with cutout spaces is provided. Each cutout space can accommodate a solar cell. In some embodiments, the cut space adapts a shape that the same or similar to that of the solar cell. In some embodiments, the EPE positioning strips has a different color from the solar cells (e.g., white, blue, green, grey, and etc.) for decorative purposes. As used herein, the term "solar cell" refers to the component for converting solar energy into electrical energy. In some embodiments, the terms "solar cell" and "battery sheet" can be used interchangeably.

Embodiment 3

The third embodiment can further comprise a third EVA layer 60 and a substrate 70. From top to bottom, the protective layer 10, the first EVA layer 20, the main body layer 30, the third EVA layer 60, the substrate 70, the second EVA layer 40 and the first supporting layer 50 are bonded together.

The substrate 70 can be one or more PET sheets. In some embodiments, the substrate can also be other materials including but not limited to plastic, metal, wood, etc. In some embodiments, for decorative purposes, the substrate can also have different colors including but not limited to white, black, red, blue, green, grey, etc.

Embodiment 4

The forth embodiment can further comprise a forth EVA layer 80 and a second supporting layer 90. From top to bottom, the protective layer 10, the first EVA layer 20, the main body layer 30, the third EVA layer 60, the substrate 70, the second EVA layer 40, the first supporting layer 50, the forth EVA layer 80 and the second supporting layer 90 can be pressed and bonded together.

The second supporting layer can be one or more TPT sheets which provides further support for the product. In some embodiments, the one or more TPT sheets can have different thicknesses. In some embodiments, the one or more TPT sheets can have different colors including but not limited to white, black, red, blue, green, grey, etc.

Embodiment 5

The fifth embodiment can further comprise a fifth EVA layer 100 and a fabric layer 110 (FIG. 1). From top to bottom, the protective layer 10, the first EVA layer 20, the main body layer 30, the third EVA layer 40, the substrate 70, the second EVA layer 60, the first supporting layer 50, the forth EVA layer 80, the second supporting layer 90, the fifth EVA layer 100 and the fabric layer 110 can be pressed and bonded together.

The bottom fabric layer 110 can use one or more 420D nylon sheets which provide a nice surface. In some embodiments, the nylon sheets can prevent the solar panels from being scratched or damaged. In some embodiments, the nylon sheets can have different colors including but not limited to white, black, red, blue, green, grey, etc.

Embodiment 6

To achieve good performance, the protective layer 10 can be one or more ETFE sheets. The solar cells 31 can be single-crystal silicon. The connectors can be copper wires. The positioning strips can be EPE strips. The substrate 70 can be one or more PET sheets. The first supporting layer 50 can be one or more epoxy boards. The second supporting layer 90 can be one or more TPT sheets. The fabric layer 110 can be one or more 420D nylon sheets. The multiple layers can be stacked in pre-determined order for good bonding. The one or more ETFE sheets as the protective layer 10 can be waterproof and aging-resistant. It can prevent the panel from being broken or scratched. The EPE strips are disposed between every two solar cells to prevent them from moving. The EPE positioning strips can have different colors for decorative purposes. Additionally the substrate 70 is also decorative. The one or more epoxy boards as the first supporting layer 50 can provide support for all the layers above it and prevent the panel from being broken. The one or more TPT sheets as the second supporting layer 90 can provide further support. The one or more 420D nylon sheets as the fabric layer can provide a decorative and protective surface.

Embodiment 7

A method for manufacturing a solar panel comprises:
1. placing the multiple layers in order and place into the laminator;
2. pumping the upper chamber for 310±20 s, and pumping the lower chamber for 300±20 s;
3. pressurizing the upper chamber to −70±5 kPa for 5±2 s while keeping the lower chamber under vacuum;
4. pressurizing the upper chamber to −60±5 kPa for 5±2 s while keeping the lower chamber under vacuum;

5. pressurizing the upper chamber to 0 kPa for 540±5 s while keeping the lower chamber under vacuum, and setting the heating temperature to 142±5° C.;
6. keeping the lower chamber under vacuum for 20±5 s;
7. inflating the lower chamber for 50±5 s.

After the above procedures, solar panels can be obtained with untrimmed edges and without any holes. For portability and cosmetic purposes, the obtained solar panels can be placed into a laser cutting machine for trimming, without damaging the solar cells 31 and the connectors. As shown in FIG. 2, installation holes 220 can be drilled at each of the four corners of the solar panel. Decorative holes 230 can also be drilled between the first solar cell group and the second solar cell group, to facility the folding.

Adaptive Charging System

Figure 3:
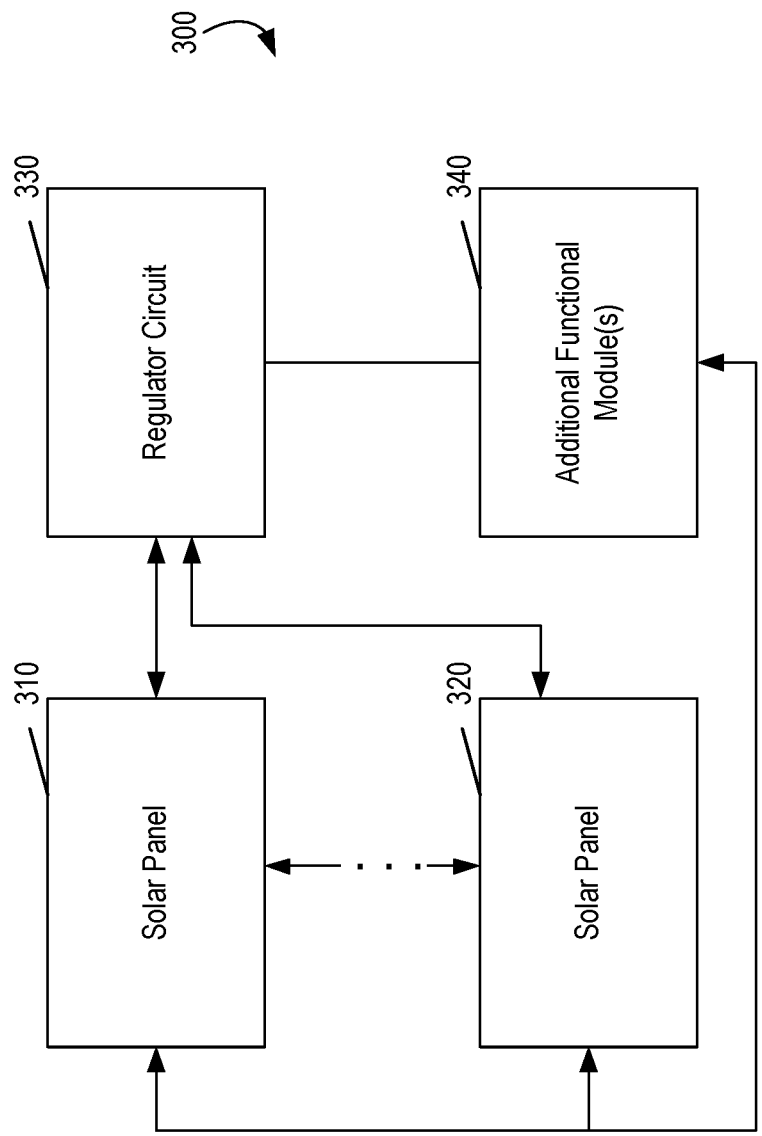
FIG. 3 shows a block diagram of an adaptive charging system in accordance with an embodiment of the present disclosure.

FIG. 3 shows a system diagram of a solar-powered adaptive charging system according to an embodiment of the present disclosure. The system can comprise one or more solar panels 310 through 320 which can be interconnected in series, in parallel or a combination thereof. The output terminals of the one or more solar panels can be connected to a voltage regulator circuit 330 which the present disclosure shows. There can be one or more additional functional modules 340 connected to the one or more solar panels 310 through 320 and/or the voltage regulator circuit 330. For example, an additional temperature control module can be connected to the solar panels to monitors the panel temperature. In some embodiments, an additional lighting module can be connected to the voltage regulator circuit to indicate the status of the system. For example, a red light can indicate the charging is ongoing and a green light can indicate the charging is complete.

Voltage Regulator

Figure 4:
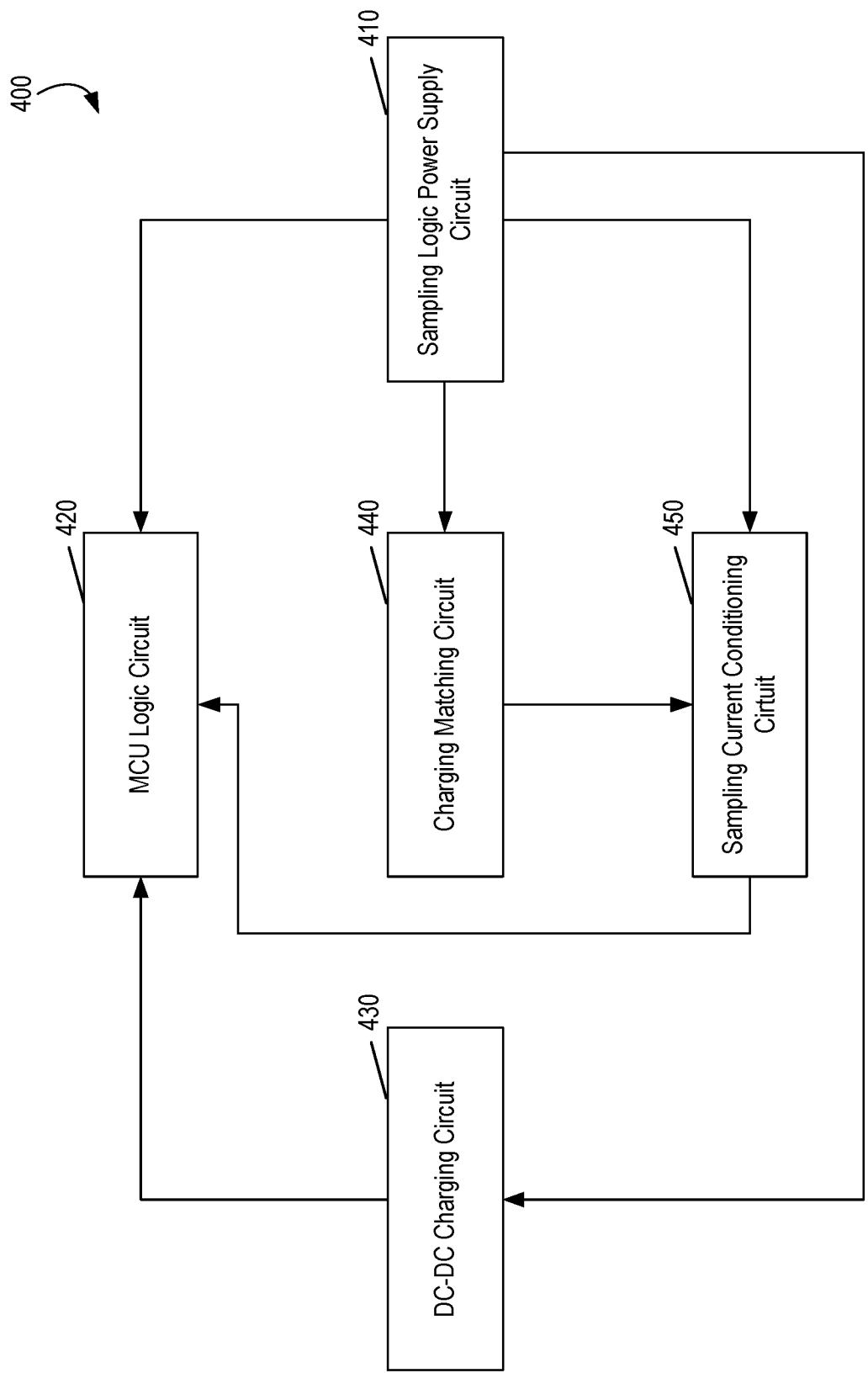
FIG. 4 depicts a block diagram of a voltage regulator circuit in accordance with an embodiment of the present disclosure.

FIG. 4 shows a block diagram of a voltage regulator for an adaptive charging system according to some embodiments of the present disclosure. It can comprises a sampling logic power supply circuit 410, a microcontroller (MCU) logic circuit 420, a DC-DC charging circuit 430, a sampling current conditioning circuit 450, and a charging matching circuit 440. When it is charging Apple® devices, it starts an automatic reset control logic. When it detects the amount of light is changing based on the sample voltage and the analog voltage signal, it keeps detecting for an additional duration of time. It only resets the voltage regulator when the amount of the light is stable. Thus, the present disclosure provides stable power supply to Apple® devices.

Figure 5:
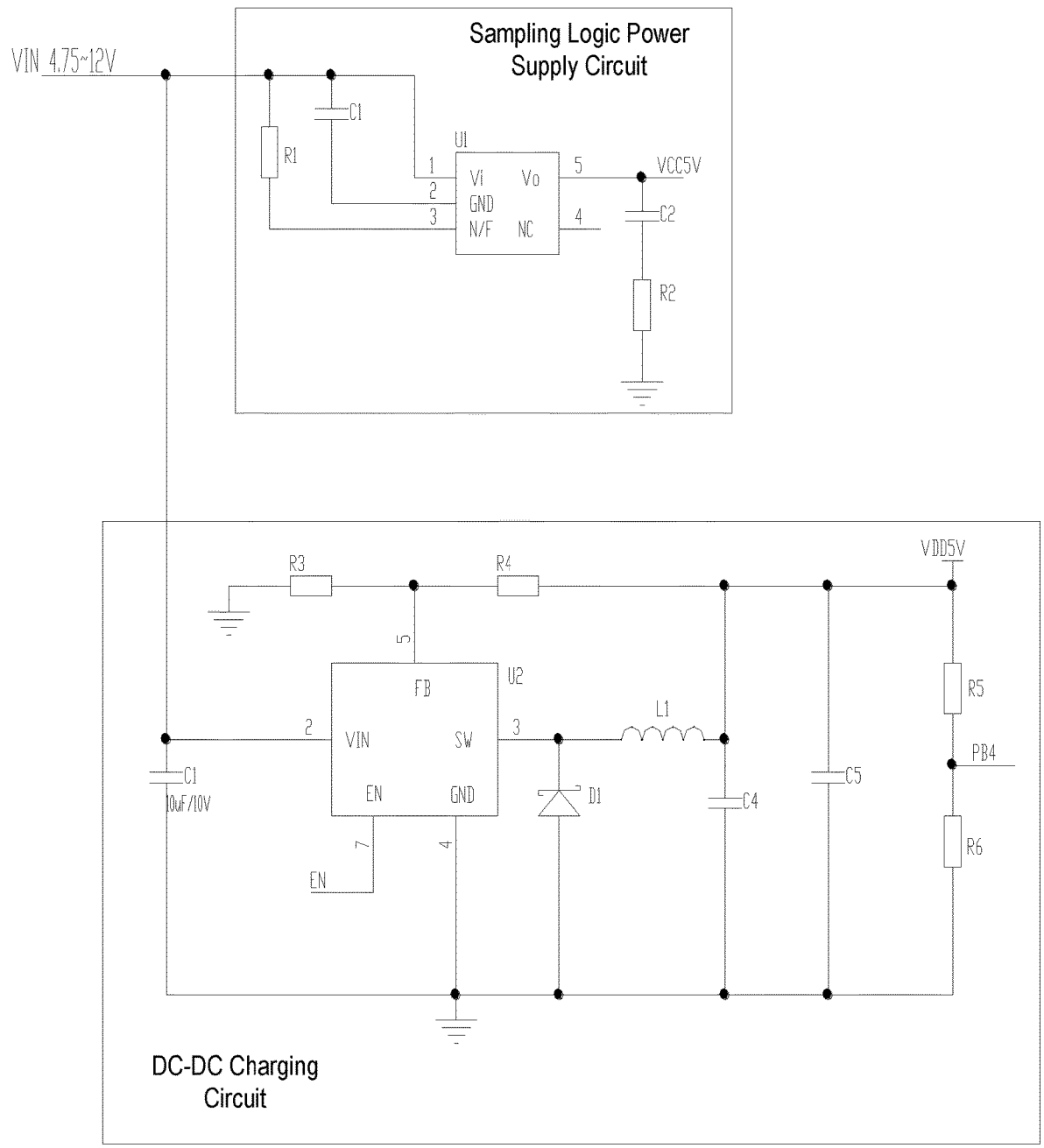
FIG. 5 shows circuit diagrams of the sampling logic power supply circuit and the DC-DC charging circuit in accordance with an embodiment of the present disclosure.

The input terminals of the sampling logic power supply circuit and the DC-DC charging circuit can be connected to the same power supply. The terminal VIN 4.75~12 V shown in FIG. 5 is the power supply terminal which has an input photovoltaic voltage of 4.75~12 V. The output terminals of the DC-DC charging circuit, the MCU logic circuit, the sampling current conditioning circuit, and the charging matching circuit can be connected to the output terminal of the sampling logic power supply circuit. The sampling voltage output terminal of the DC-DC charging circuit can be connected to the sampling voltage input terminal of the MCU logic circuit. The voltage output terminal of the charging matching circuit can be connected to the input terminal of the sampling current conditioning circuit. The output terminal of the sampling current conditioning circuit can be connected to the voltage input terminal of the MCU logic circuit. The sampling logic power supply circuit provides power to the DC-DC charging circuit, the MCU logic circuit, the sampling current conditioning circuit and the charging matching circuit. The DC-DC charging circuit samples the power supply voltage and outputs the sampled voltage to the MCU logic circuit. The charging matching circuit converts the charging current from the sampling logic power supply circuit to a voltage signal. The sampling current conditioning circuit converts the voltage signal to an analog voltage signal and outputs to the MCU logic circuit. The MCU logic circuit receives the sampled voltage from the DC-DC charging circuit and the analog voltage signal from the sampling current conditioning circuit, and controls the on and off of the DC-DC charging circuit.

In particular, as shown in FIG. 5, the sampling logic power supply circuit can comprise a resistor R1, a resistor R2, a capacitor C1, a capacitor C2, and a power supply integrated circuit chip U1. One terminal of the resistor R1, one terminal of the capacitor C1 and the input supply voltage terminal of the power supply chip U1 can all be connected to the power supply. The other terminal of the capacitor C1 can be connected to the ground terminal of the power supply chip U1. The other terminal of the resistor R1 can be connected to the enable input terminal of the power supply chip U1. One terminal of the resistor R2 can be connected to the output terminal of the power supply chip U1 through the capacitor C2 and the other terminal of the resistor R2 can be connected to the ground. Input supply terminals of the DC-DC charging circuit, the MCU logic circuit, the sampling current conditioning circuit, and the charging matching circuit can all be connected to the output terminal of the power supply chip U1. The sampling logic power supply circuit provides independent power supply to the MCU logic circuit. In some embodiments, the power supply chip U1 can be preferably but not limited to TPS76333DBVR from Texas Instruments.

The DC-DC charging circuit can comprise a resistor R3, a resistor R4, a resistor R5, and a resistor R6. It can also comprise a capacitor C3, a capacitor C4, and a capacitor C5. It can also comprise a diode D1, an inductor L1 and a converter U2. The input supply terminal of the converter U2 and one terminal of the capacitor C3 can be connected to the power supply. One terminal of the resistor R3 and one terminal of the resistor R4 can all be connected to the power switch output terminal of the converter U2. The other terminal of the resistor R3 can be connected to the ground. The other terminal of the resistor R4, one terminal of the inductor L1, one terminal of the capacitor C4, and one terminal of the resistor R5 can all be connected to the power supply terminal of the charging matching circuit. The other terminal of the inductor L1 and the negative terminal of the diode D1 can be connected to the enable terminal of the converter U2. The other terminal of the resistor R5 and the one terminal of the resistor R6 can be connected to the sampling voltage input terminal of the MCU logic circuit. The ground terminal of the converter U2, the negative terminal of the diode D1, the other terminal of the capacitor C3, the other terminal of the capacitor C4, and the other terminal of the resistor R6 can all be connected to the ground. The capacitors C5 and C4 are connected in parallel. One terminal of the resistor R5 can be connected to the output terminal of the power supply chip U1. The terminal VDD 5V in the DC-DC charging circuit as shown in FIG. 2 is connected to the VCC 5V terminal in the sampling logic power supply circuit. The converter U2 is a step down DC/DC converter, and it can be preferably but not limited to TD1583 or XL1583. The peripheral circuit (including the resistor R3, the resistor R4, the capacitor C3, the capacitor C4, the capacitor C5, the inductor L1, and the diode D1) forms a low-power, small-footprint, low-weight, high-accuracy, low-ripple DC-DC source with a maximum output current of 3 A. It divides the voltage through the resistors R5 and R6, samples the charging voltage, and provides the sampled voltage to the MCU logic circuit for logic control.

Figure 6:
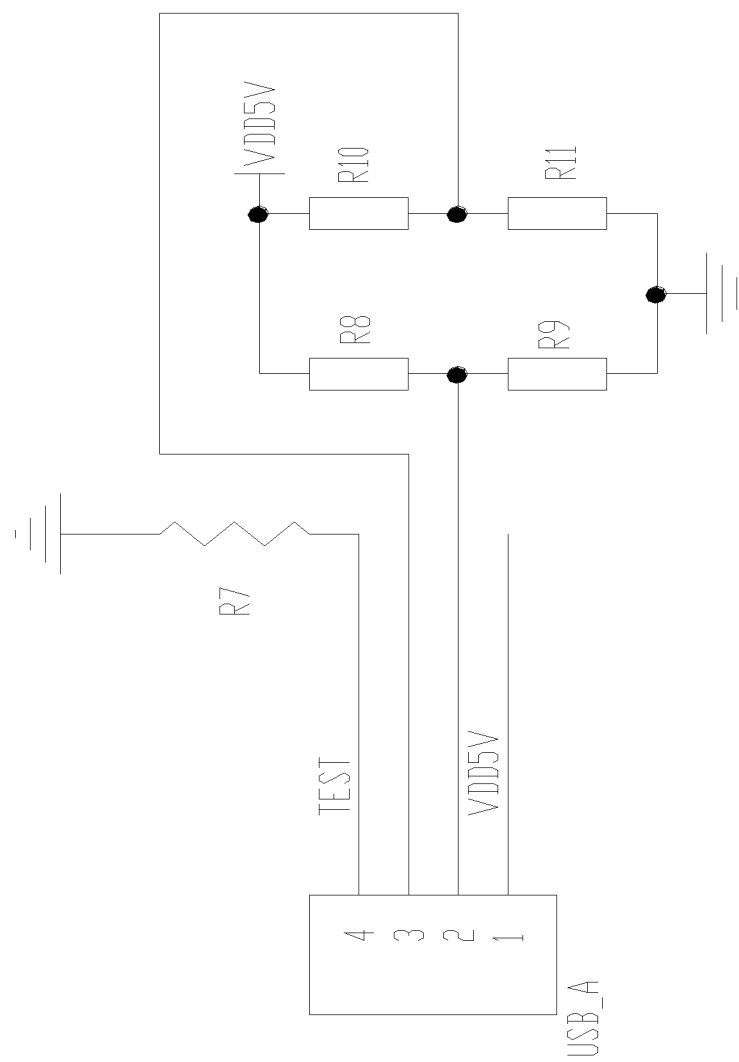
FIG. 6 shows a circuit diagram of the charging matching circuit in accordance with an embodiment of the present disclosure.

As shown in FIG. 6, the charging matching circuit can comprise a USB port, a resistor R7, a resistor R8, a resistor R9, a resistor R10, and a resistor R11. One terminal of the resistor R7 can be connected to the forth pin of the USB port. Resistors R8 and R9 can be connected in series, forming a first serial branch. Resistors R10 and R11 can be connected in series, forming a second serial branch. The third pin of the USB port can be connected between the resistor R10 and the resistor R11. The second pin of the USB port can be connected between the resistor R8 and the resistor R9. The first pin of the USB port, one terminal of the first serial branch, and one terminal of the second serial branch can all be connected to the output terminal of the power supply chip U1. The other terminal of the first serial branch, the other terminal of the second serial branch, the input terminal of the sampling current conditioning circuit can all be connected to the forth pin of the USB port. The charging matching circuit realizes the match of charging for Apple devices. It also samples the charging current and converts it to a voltage signal. The VDD 5V terminal in FIG. 6 is connected to the VCC 5V terminal of the sampling logic power supply circuit in FIG. 5.

Figure 7:
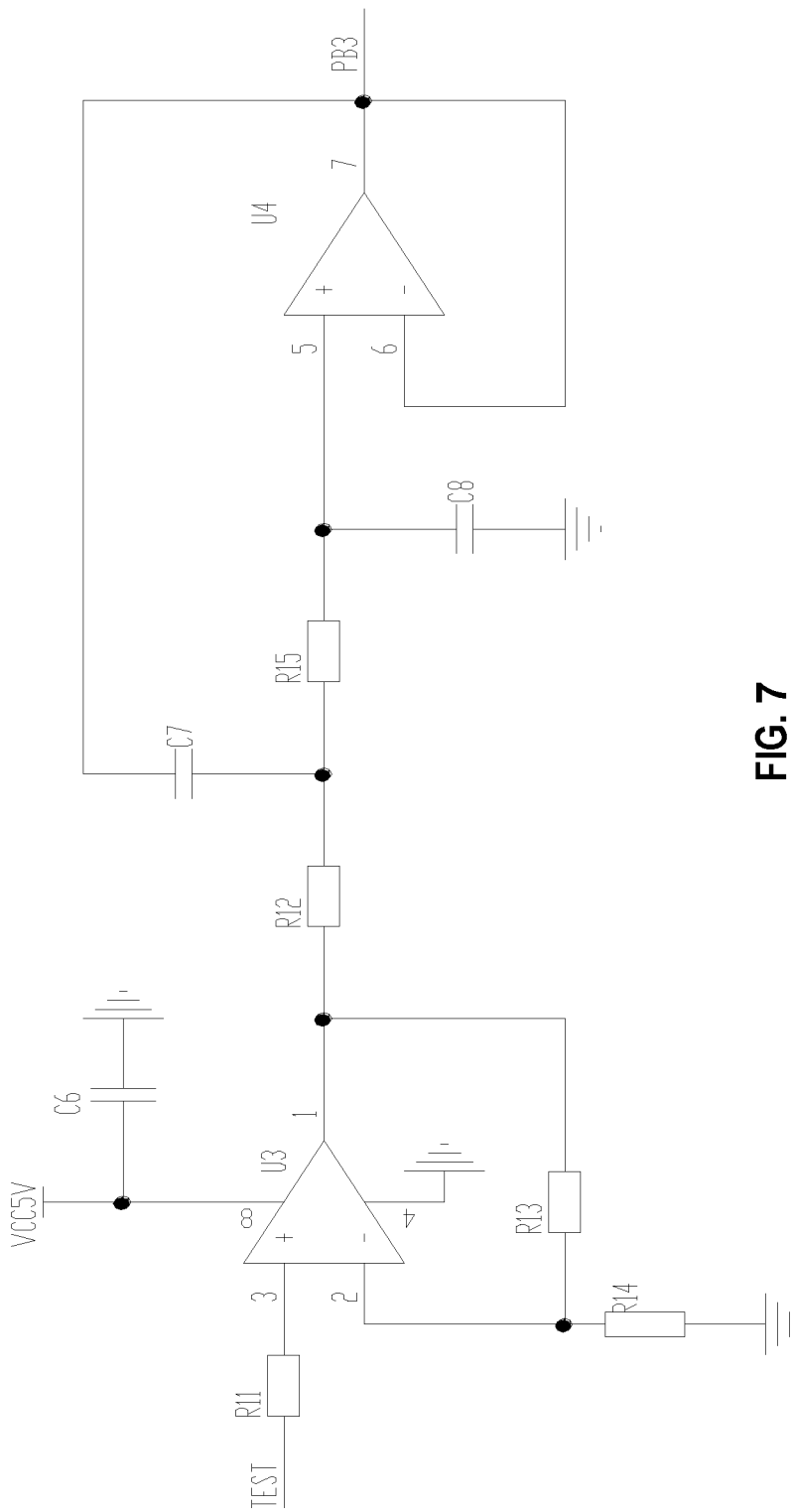
FIG. 7 shows a circuit diagram of the sampling current conditioning circuit in accordance with an embodiment of the present disclosure.

As shown in FIG. 7, the sampling current conditioning circuit can comprise the resistor R11, a resistor R12, a resistor R13, a resistor R14, a resistor R15, a capacitor C6, a capacitor C7, a capacitor C8, an operational amplifier U3, and an operational amplifier U4. The non-inverting input terminal of the operational amplifier U3 can be connected the forth pin of the USB port through the resistor R11. The supply voltage terminal of the operational amplifier U3 and one terminal of the capacitor C6 can be connected to the output terminal of the power supply chip U1. The other terminal of the capacitor C6 can be connected to the ground. One terminal of the resistor R12 and one terminal of the resistor R13 can be connected to the output terminal of the operational amplifier U3. The other terminal of the resistor R13 and one terminal of the resistor R14 can be connected to the inverting terminal of the operational amplifier U3. The other terminal of the resistor R14 can be connected to the ground. The other terminal of the resistor R12 can be connected to the non-inverting input terminal of the operational amplifier U4 through the resistor R15. One terminal of the capacitor C7 can be connected between the resistor R12 and the resistor R15, and the other terminal of the capacitor C7 can be connected to the output terminal of the operational amplifier U4. One terminal of the capacitor C8 can be connected between the resistor R15 and the non-inverting input terminal of the operational amplifier U4, and the other terminal of the capacitor C8 can be connected to the ground. The inverting input terminal and the output terminal of the operation amplifier U4 can be connected to the amplified voltage input terminal of the MCU logic circuit. The sampling current conditioning circuit amplifies and filters the voltage signal from the charging matching circuit, converts it to more resolvable analog signal which is provided to the MCU logic circuit for control logic. In some embodiments, the operational amplifiers U3 and U4 can be preferably but not limited to LM2904.

Figure 8:
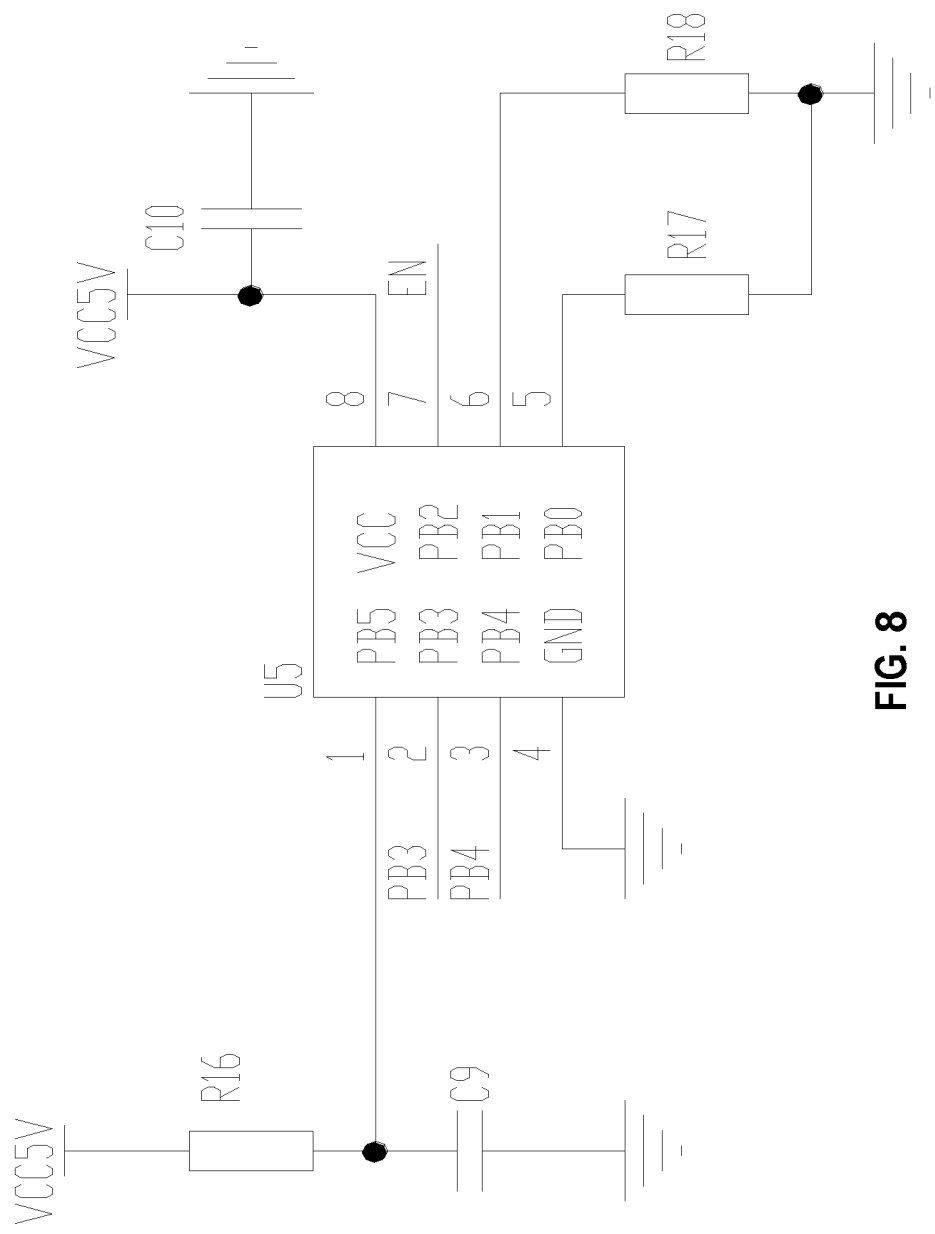
FIG. 8 shows a circuit diagram of the MCU logic circuit in accordance with an embodiment of the present disclosure.

As shown in FIG. 8, the MCU logic circuit can comprise a resistor R16, a resistor R17, a resistor R18, a capacitor C9, a capacitor C10, and a microcontroller U5. One terminal of the capacitor C9 can be connected to the output terminal of the power supply chip U1 through the resistor R16. The PB5 terminal of the microcontroller U5 can be connected between the resistor R16 and the capacitor C9. The PB4 terminal of the microcontroller U5 can be connected between the resistor R5 and the resistor R6. The PB3 terminal of the microcontroller U5 can be connected to the output terminal of the operational amplifier U4. The supply voltage terminal of the microcontroller U5 and one terminal of the capacitor C10 can be connected to the output terminal of the power supply chip U1. The other terminal of the capacitor C10 can be connected to the ground. One terminal of the resistor R17 can be connected to the PB0 terminal of the microcontroller U5. One terminal of the resistor R18 can be connected to the PB1 terminal of the microcontroller U5. The other terminals of the resistors R17 and R18 can be connected to the ground. In some embodiments, the microcontroller U5 can be preferably but not limited to ARtiny13.

The MCU logic circuit receives the sampled voltage and the converted analog signal from the sampling current conditioning circuit, and perform logic operation. The MCU logic circuit obtains the value of the charging current based on the analog voltage signal from the sampling current conditioning circuit and the resistance of the resistor R7 in FIG. 6. If it determines that the sampled voltage from the DC-DC charging circuit is larger than a first pre-determined voltage value during a first pre-determined duration of time t1. It then determines if the charging current is larger than a pre-determined current value. If yes, the MCU logic circuit can turn off the DC-DC charging circuit and turn it on after a second pre-determined duration of time t2. The second pre-determined duration of time t2 is determined by t2=t1*a, where a is a pre-determined scale factor. Usually the charging voltage which is also the voltage being sampled is lower than 4.85 V before the battery is fully charged, unless Apple® devices enter protection mode. In some embodiments, if the present disclosure can detect the charging voltage is higher than 4.85 V, it can continue monitoring for an additional duration of time. If the charging voltage is higher than the normal working voltage of 4.85 V during a duration of time longer than 75% of the first pre-determined time (for example, 95 seconds), the present disclosure detects if the charging current is less than 400 mA for an additional duration of time. If the criteria is met, it can pull down the voltage level at the pin 7 (PB2) of the microcontroller U5. Meanwhile, the voltage level of the pin 7 of the converter U2 can be also pulled down and the converter U2 stops working. When the second pre-determined duration of time (for example, 1 second) is reached, the microcontroller U5 restarts the converter U2. The total cycle time can be preferably but not limited to roughly 100 seconds.

The present disclosure can distinguish between Apple® devices and non-Apple® devices at the USB port. When the MCU logic circuit detects that a non-Apple® device is connected, it does not run the automatic reset control logic. The charger charges the non-Apple® device normally. When the MCU logic circuit detects that an Apple® device is connected, it starts to run the automatic reset control logic. If it detects changes in the amount of light, it can continue detecting for an additional 100 seconds. If it determines the amount of light increases and is stable, it can reset the voltage regulator. If it determines the amount of light is not stable, it does not reset the voltage regulator. It keeps low charging current and starts another detection cycle. This user-friendly feature greatly improves user experience.

In some embodiments, the present disclosure can detect a type of a device to be charged, e.g. a mobile phone, a tablet, a laptop, etc. It then can adjust the voltage regulator accordingly to provide a charging voltage.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of at least one particular implementation in at least one particular environment for at least one particular purpose, those of ordinary skill in the art will recognize that its usefulness is not limited thereto and that the present disclosure can be beneficially implemented in any number of environment for any number of purposes.

We claim:

1. A method of adaptive charging comprising:
   providing an adaptive charging device comprising a solar panel; and a voltage regulator, wherein the voltage regulator comprises a sampling logic power supply circuit; a microcontroller (MCU) logic circuit; a DC-DC charging circuit; a sampling current conditioning circuit and a charging matching circuit;
   connecting input terminals of the sampling logic power supply circuit and the DC-DC charging circuit to a power supply;
   connecting input terminals of the DC-DC charging circuit, the MCU logic circuit, the sampling current conditioning circuit, and the charging matching circuit to an output terminal of the sampling logic power supply circuit;
   connecting a sampling voltage output terminal of the DC-DC charging circuit to a sampling voltage input terminal of the MCU logic circuit;
   connecting a voltage output terminal of the charging matching circuit to an input terminal of the sampling current conditioning circuit; and
   connecting an output terminal of the sampling current conditioning circuit to an amplified voltage input terminal of the MCU logic circuit;
   providing power, by the sampling logic power supply circuit, to the DC-DC charging circuit, the MCU logic circuit, the sampling current conditioning circuit and the charging matching circuit;
   sampling a power supply voltage and outputting the sampled voltage, by the DC-DC charging circuit, to the MCU logic circuit;
   converting, by the charging matching circuit, a charging current from the sampling logic power supply circuit to a voltage signal;
   converting, by the sampling current conditioning circuit, the voltage signal to an analog voltage and output to the MCU logic circuit;
   determining, by a processor circuit of a voltage regulator of the adaptive charging device, a charging voltage;
   in response to a determined charging voltage that is higher than a pre-defined voltage for a first duration of time, determining, by the processor circuit, a charging current; and
   in response to a determined charging current that is lower than a pre-defined current, restarting, by the processor circuit, the voltage regulator after a second duration of time.

2. The method of claim 1, wherein the pre-defined voltage is 4.0-5.0 V.

3. The method of claim 1, wherein the pre-defined voltage is 4.85 V.

4. The method of claim 1, wherein the pre-defined current is 100-1000 mA.

5. The method of claim 1, wherein the pre-defined current is 400 mA.

6. The method of claim 1, wherein the first duration of time is 10-100 seconds.

7. The method of claim 1, wherein the second duration of time is 1-5 seconds.

8. An adaptive charging system comprising:
   a solar panel; and
   a voltage regulator, wherein the voltage regulator comprises:
   a sampling logic power supply circuit;
   a microcontroller (MCU) logic circuit;
   a DC-DC charging circuit;
   a sampling current conditioning circuit; and
   a charging matching circuit,
   wherein:
   input terminals of the sampling logic power supply circuit and the DC-DC charging circuit are connected to a power supply;
   input terminals of the DC-DC charging circuit, the MCU logic circuit, the sampling current conditioning circuit, and the charging matching circuit are connected to an output terminal of the sampling logic power supply circuit;
   a sampling voltage output terminal of the DC-DC charging circuit are connected to a sampling voltage input terminal of the MCU logic circuit;
   a voltage output terminal of the charging matching circuit are connected to an input terminal of the sampling current conditioning circuit; and
   an output terminal of the sampling current conditioning circuit are connected to an amplified voltage input terminal of the MCU logic circuit;
   wherein the sampling logic power supply circuit is configured to provide power to the DC-DC charging circuit, the MCU logic circuit, the sampling current conditioning circuit and the charging matching circuit;
   the DC-DC charging circuit is configured to sample a power supply voltage and output the sampled voltage to the MCU logic circuit;
   the charging matching circuit is configured to convert a charging current from the sampling logic power supply circuit to a voltage signal; and
   the sampling current conditioning circuit is configured to convert the voltage signal to an analog voltage and output to the MCU logic circuit.

9. The system of claim 8, wherein the MCU logic circuit is configured to determine the charging current from the analog voltage from the sampling current conditioning circuit.

10. The system of claim 9, wherein in response to the sampled voltage from the DC-DC charging circuit being larger than a pre-determined voltage during a first duration of time t1 and a charging current being smaller than a pre-determined current, the MCU logic circuit is configured to restart the DC-DC charging circuit after a second duration of time t2, the second duration of time t2 being determined by t2=t1*a, where a is a pre-determined scale factor.

11. The system of claim 8, wherein the sampling logic power supply circuit comprises a resistor R1, a resistor R2, a capacitor C1, a capacitor C2, and a power supply integrated circuit chip U1.

12. The system of claim 11, wherein:
a terminal of the resistor R1, a terminal of the capacitor C1 and an input supply voltage terminal of the power supply chip U1 are connected to the power supply;
a terminal of the capacitor C1 is connected to a ground terminal of the power supply chip U1;
a terminal of the resistor R1 is connected to an enable input terminal of the power supply chip U1;
a terminal of the resistor R2 is connected to an output terminal of the power supply chip U1 through the capacitor C2;
a terminal of the resistor R2 is connected to ground; and
input supply terminals of the DC-DC charging circuit, the MCU logic circuit, the sampling current conditioning circuit, and the charging matching circuit are connected to the output terminal of the power supply chip U1.

13. The system of claim 12, wherein the DC-DC charging circuit comprises a resistor R3, a resistor R4, a resistor R5, a resistor R6, a capacitor C3, a capacitor C4, a capacitor C5, a diode D1, an inductor L1, and a converter U2.

14. The system of claim 13, wherein:
an input supply terminal of the converter U2 and a terminal of the capacitor C3 are connected to the power supply;
a terminal of the resistor R3 and a terminal of the resistor R4 are connected to a power switch output terminal of the converter U2;
a terminal of the resistor R3 is connected to ground;
a terminal of the resistor R4, a terminal of the inductor L1, a terminal of the capacitor C4, and a terminal of the resistor R5 are connected to a power supply terminal of the charging matching circuit;
a terminal of the inductor L1 and a negative terminal of the diode D1 are connected to an enable terminal of the converter U2;
a terminal of the resistor R5 and a terminal of the resistor R6 are connected to a sampling voltage input terminal of the MCU logic circuit;
a ground terminal of the converter U2, the negative terminal of the diode D1, a terminal of the capacitor C3, a terminal of the capacitor C4, and a terminal of the resistor R6 are connected to ground; and
the capacitors C5 and C4 are connected in parallel, a terminal of the resistor R5 is connected to the output terminal of the power supply chip U1.

15. The system of claim 14, wherein the converter U2 is TD1583.

16. The system of claim 14, wherein the converter U2 is XL1583.

17. The system of claim 14, wherein the charging matching circuit comprises a USB port, a resistor R7, a resistor R8, a resistor R9, a resistor R10, and a resistor R11.

18. The system of claim 17, wherein:
a terminal of the resistor R7 is connected to a fourth pin of the USB port;
resistors R8 and R9 are connected in series and form a first serial branch;
resistors R10 and R11 are connected in series and form a second serial branch;
a third pin of the USB port is connected between the resistor R10 and the resistor R11, a second pin of the USB port is connected between the resistor R8 and the resistor R9;
a first pin of the USB port, a terminal of the first serial branch, and a terminal of the second serial branch are connected to the output terminal of the power supply chip U1; and a terminal of the first serial branch, a terminal of the second serial branch, the input terminal of the sampling current conditioning circuit are connected to the fourth pin of the USB port.

19. The system of claim 18, wherein the sampling current conditioning circuit comprises the resistor R11, a resistor R12, a resistor R13, a resistor R14, a resistor R15, a capacitor C6, a capacitor C7, a capacitor C8, an operational amplifier U3, and an operational amplifier U4.

20. The system of claim 19, wherein:
a non-inverting input terminal of the operational amplifier U3 is connected to the fourth pin of the USB port through the resistor R11;
a supply voltage terminal of the operational amplifier U3 and a terminal of the capacitor C6 are connected to the output terminal of the power supply chip U1;
a terminal of the capacitor C6 is connected to ground;
a terminal of the resistor R12 and a terminal of the resistor R13 are connected to an output terminal of the operational amplifier U3;
a terminal of the resistor R13 and a terminal of the resistor R14 are connected to an inverting terminal of the operational amplifier U3;
a terminal of the resistor R14 is connected to ground;
a terminal of the resistor R12 is connected to a non-inverting input terminal of the operational amplifier U4 through the resistor R15;
a terminal of the capacitor C7 is connected between the resistor R12 and the resistor R15;
a terminal of the capacitor C7 is connected to an output terminal of the operational amplifier U4;
a terminal of the capacitor C8 is connected between the resistor R15 and the non-inverting input terminal of the operational amplifier U4;
a terminal of the capacitor C8 is connected to ground; and
an inverting input terminal and an output terminal of the operation amplifier U4 are connected to the input voltage terminal of the MCU logic circuit.

21. The system of claim 20, wherein each of the operational amplifiers U3 and U4 is LM2904.

22. The system of claim 20, wherein the MCU logic circuit comprises a resistor R16, a resistor R17, a resistor R18, a capacitor C9, a capacitor C10, and a microcontroller U5.

23. The system of claim 22, wherein
a terminal of the capacitor C9 is connected to the output terminal of the power supply chip U1 through the resistor R16;
a PB5 terminal of the microcontroller U5 is connected between the resistor R16 and the capacitor C9;
a PB4 terminal of the microcontroller U5 is connected between the resistor R5 and the resistor R6;
a PB3 terminal of the microcontroller U5 is connected to the output terminal of the operational amplifier U4;
a supply voltage terminal of the microcontroller U5 and a terminal of the capacitor C10 are connected to the output terminal of the power supply chip U1;
a terminal of the capacitor C10 is connected to ground;
a terminal of the resistor R17 is connected to a PB0 terminal of the microcontroller U5;
a terminal of the resistor R18 is connected to a PB1 terminal of the microcontroller U5; and
a terminal of the resistors R17 and R18 are connected to ground.

24. The system of claim 23, wherein the microcontroller U5 is ATtiny13.

\* \* \* \* \*